(12) United States Patent
Lin et al.

(10) Patent No.: US 12,490,510 B2
(45) Date of Patent: Dec. 2, 2025

(54) SEMICONDUCTOR DEVICE AND METHOD OF FORMING THE SAME

(71) Applicant: Taiwan Semiconductor Manufacturing Co., Ltd., Hsinchu (TW)

(72) Inventors: Meng-Han Lin, Hsinchu (TW); Te-An Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 381 days.

(21) Appl. No.: 16/991,027

(22) Filed: Aug. 12, 2020

(65) Prior Publication Data

US 2022/0052041 A1 Feb. 17, 2022

(51) Int. Cl.

| | |
|---|---|
| H10D 84/83 | (2025.01) |
| H01L 21/28 | (2006.01) |
| H10D 64/01 | (2025.01) |
| H10D 64/27 | (2025.01) |
| H10D 64/66 | (2025.01) |
| H10D 84/01 | (2025.01) |
| H10D 84/03 | (2025.01) |
| H10D 84/85 | (2025.01) |

(52) U.S. Cl.
CPC ..... *H10D 84/856* (2025.01); *H01L 21/28052* (2013.01); *H10D 64/017* (2025.01); *H10D 64/518* (2025.01); *H10D 64/663* (2025.01); *H10D 84/0177* (2025.01); *H10D 84/0179* (2025.01); *H10D 84/038* (2025.01); *H10D 84/83135* (2025.01); *H10D 84/83138* (2025.01); *H10D 84/8314* (2025.01)

(58) Field of Classification Search
CPC ....... H01L 21/823456; H01L 21/82385; H01L 21/82345; H01L 21/823842; H01L 27/0922; H10D 84/83135–8314; H10D 84/856

See application file for complete search history.

(56) References Cited

U.S. PATENT DOCUMENTS

| | | | | |
|---|---|---|---|---|
| 6,621,114 B1* | 9/2003 | Kim | ...................... | H01L 29/513 438/290 |
| 2006/0163662 A1* | 7/2006 | Kinoshita | ......... | H01L 21/28097 257/E21.426 |
| 2009/0014812 A1* | 1/2009 | Wang | .............. | H01L 21/823835 257/E27.061 |
| 2012/0248537 A1* | 10/2012 | Cai | ................... | H01L 21/28176 438/586 |
| 2013/0264652 A1* | 10/2013 | Zhu | ................ | H01L 21/823842 257/369 |
| 2018/0269115 A1* | 9/2018 | Julien | .................... | H10D 87/00 |

* cited by examiner

*Primary Examiner* — Bryan R Junge

(74) *Attorney, Agent, or Firm* — JCIPRNET

(57) ABSTRACT

A semiconductor device includes a substrate, a metal gate and a poly gate. The substrate includes a first region and a second region. The metal gate is disposed on the first region of the substrate. The poly gate is disposed on the second region of the substrate. A gate area of the poly gate is greater than that of the metal gate.

18 Claims, 22 Drawing Sheets

SEMICONDUCTOR DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, high voltage technology has been widely used in power management, regulators, battery protectors, DC motors, automotive circuits, panel display drivers, etc. On the other hand, low voltage technology is typically used for logic cores, microprocessors, and microcontrollers. Some modern IC designs integrate both high voltage and low voltage devices on a single chip. The gate area of the high voltage devices is usually larger than that of the low voltage devices. The larger gate area of the high voltage devices results in dishing issue during the successive Chemical Mechanical Polishing (CMP) processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
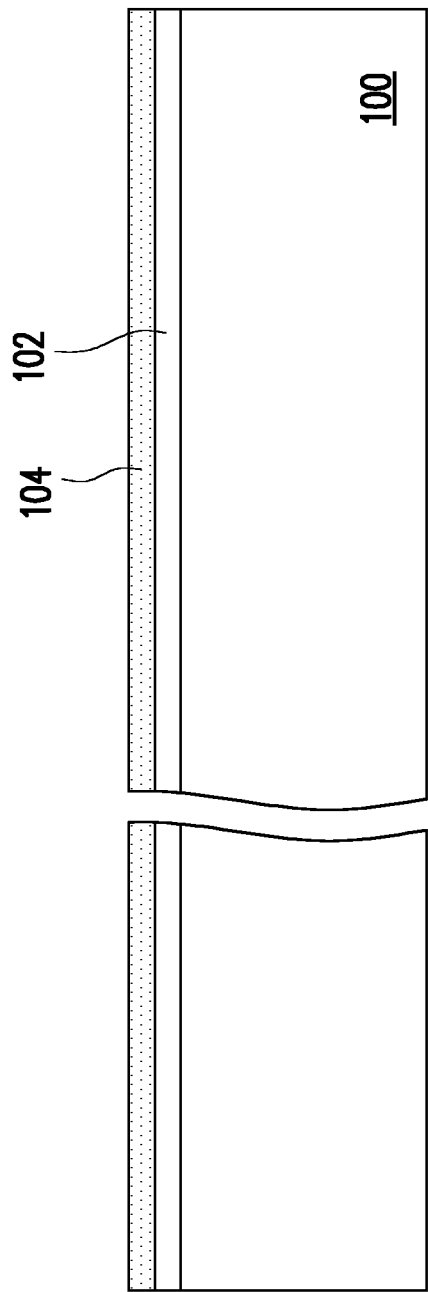
FIGS. 1 through 22 are cross-sectional views schematically illustrating a process flow for fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 22 are cross-sectional views schematically illustrating a process flow for fabricating a semiconductor device in accordance with some embodiments of the present disclosure.

Referring to FIG. 1, a substrate 100 is provided. For example, the substrate 100 may be or may include a semiconductor substrate, such as a bulk semiconductor substrate, a semiconductor-on-insulator (SOI) substrate, or the like. In some embodiments, the substrate 100 includes a semiconductor wafer, such as a silicon wafer. In some other embodiments, the substrate 100 includes an elementary semiconductor substrate such as germanium; a compound semiconductor substrate including silicon carbon, gallium arsenic, gallium phosphide, indium phosphide, indium arsenide, and/or indium antimonide; an alloy semiconductor substrate including SiGe, GaAsP, AlInAs, AlGaAs, GaInAs, GaInP, and/or GaInAsP; or combinations thereof. Other semiconductor substrates such as multi-layered or gradient substrates may also be used.

In some embodiments, a pad layer 102 is formed on the substrate 100 and a hard mask material layer 104 is formed on the pad layer 102. The materials of the pad layer 102 and the hard mask material layer 104 may be different. For example, the pad layer 102 may be a silicon oxide (SiOx, x>0) layer and the hard mask material layer 104 may be a silicon nitride (SiNy, y>0) layer. The materials of the pad layer 102 and the hard mask material layer 104 are merely for illustration and the disclosure is not limited thereto.

Figure 2:
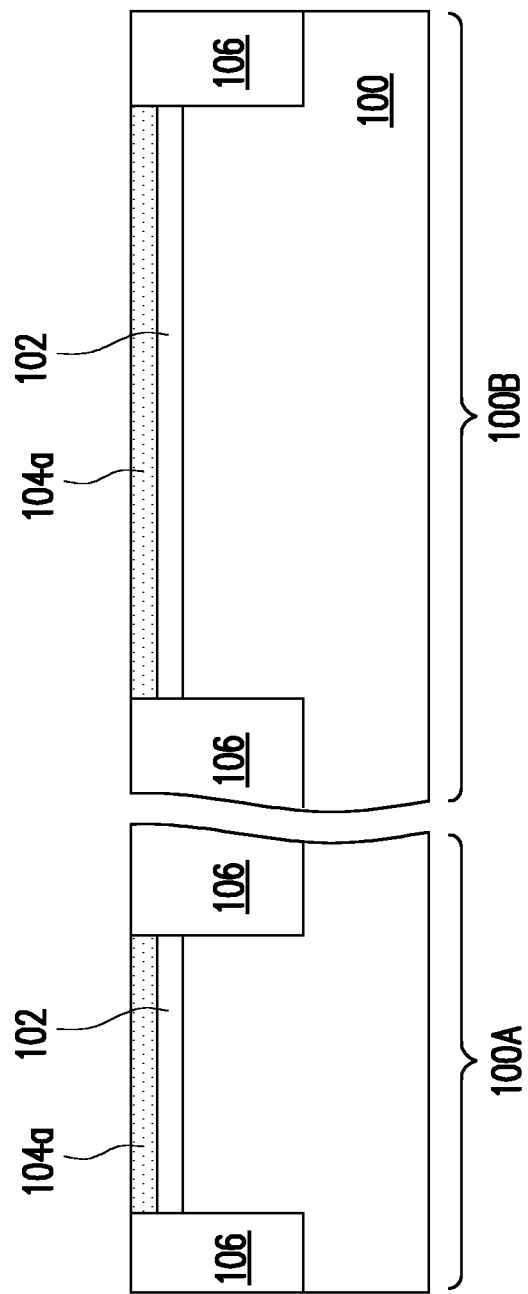

Referring to FIG. 1 and FIG. 2, a trench isolation fabrication process is performed on the substrate 100 such that isolation structures 106 are formed in the substrate 100 to define active regions. The isolation structures 106 are, for example, shallow trench isolation (STI) structures, or the like. In some embodiments, the trench isolation fabrication process may include the following processes. First, the hard mask material layer 104 may be patterned to form a hard mask layer 104a. The hard mask layer 104a may be formed by photolithograph and etching processes. Thereafter, by using the hard mask layer 104a as an etching mask, the substrate 100 and the pad layer 102 are etched to form trenches. A dielectric material is then deposited to fill the trenches and cover the hard mask layer 104a. A planarization process, such as a CMP process or an etch-back process is performed to remove the excess dielectric material outside the trenches until the hard mask layer 104a is exposed, as shown in FIG. 2, thereby forming the isolation structures 106. As such, active regions are defined in the substrate 100 through the isolation structures 106.

In some embodiments, after the isolation structures 106 are formed, a first region 100A and a second region 100B of the semiconductor substrate 100 are defined. In some embodiments, the first region 100A may be a core device region, and the second region 100B may be a high-voltage device region. In some embodiments, the first region 100A is connected to the second region 100B. In some embodiments, the first region 100A is spaced apart from the second region 100B by other regions.

Figure 3:
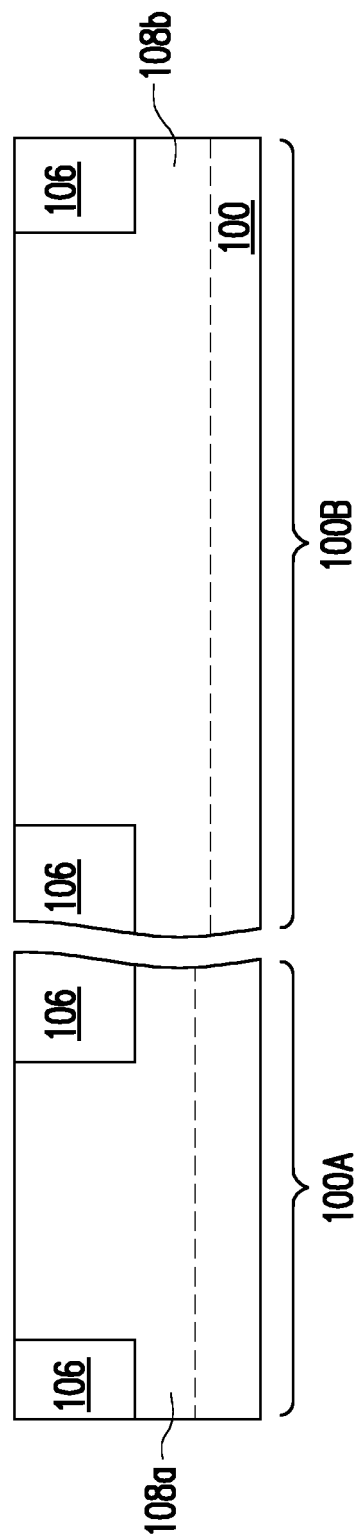

Referring to FIG. 2 and FIG. 3, the hard mask layer 104a and the pad layer 102 are removed until the semiconductor substrate 100 is exposed. In some embodiments, the removal of the hard mask layer 104a and the pad layer 102 may be performed by etching processes, such as dry etching, wet etching or a combination thereof. Other suitable removal processes may also be used. In some embodiments, portions of the isolation structures 106 are partially removed such that the top surfaces of the isolation structures 106 and the top surface of the semiconductor substrate 100 are substantially at the same level.

In some embodiments, after the hard mask layer 104a and the pad layer 102 are removed, a well region 108a is formed in the first region 100A of the substrate 100, and a well region 108b is formed in the second region 100B of the substrate 100. The well region 108a may be p-type well or n-type well, and the well region 108b may be p-type well or n-type well. For example, when the well region 108a and/or the well region 108b are n-type wells, n-type dopants (e.g., phosphorous or arsenic) may be doped into the active regions of the substrate 100 to form the well region 108a and/or the well region 108b. Similarly, when the well region 108a and/or the well region 108b are p-type wells, p-type dopants (e.g., boron or $BF_2$) may be doped into the active regions of the substrate 100 to form the well region 108a and/or the well region 108b. In some embodiments, the dopant concentrations and/or the depths of the well region 108a and the well region 108b may be the same or different. In some embodiments, the dopant concentration of the well region 108b is less than that of the well region 108a, and the depth of the well region 108b is deeper than that of the well region 108a, but the disclosure is not limited thereto.

In some embodiments, the well region 108a and the well region 108b are successively formed in the substrate 100 by implantation processes. For example, a first patterned mask is formed to cover the second region 100B and expose the first region 100A, and a first implantation process is performed on the first region 100A of the substrate 100 to form the well region 108a. Thereafter, the first patterned mask is removed, and a second patterned mask layer is formed to cover the first region 100A and expose the second region 100B, and a second implantation process is then performed on the second region 100B of the substrate 100 to form the well region 108b.

Figure 4:
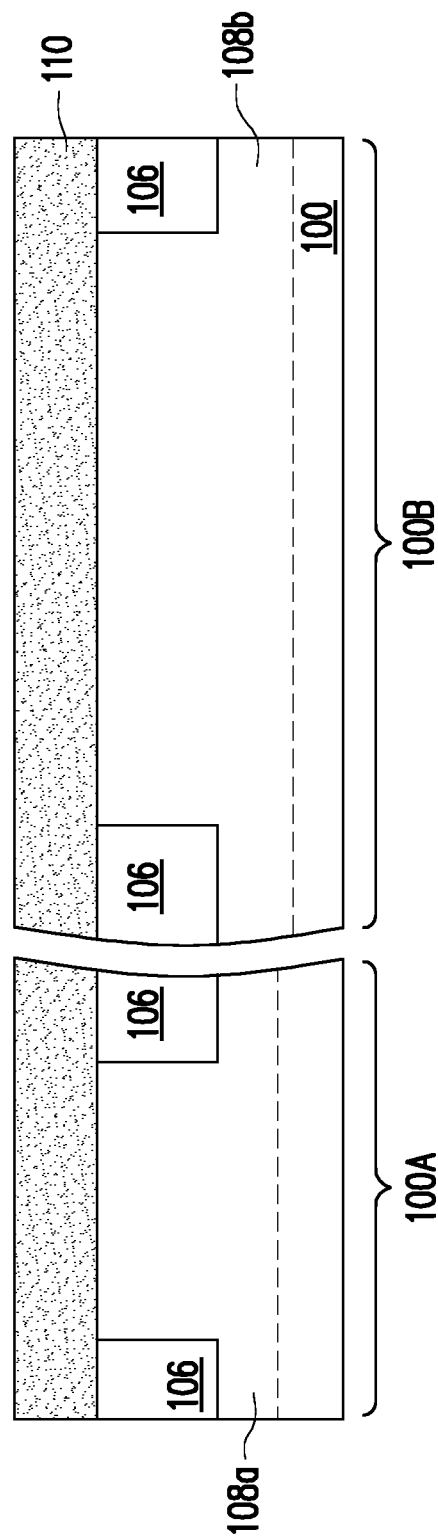

Referring to FIG. 3 and FIG. 4, a dielectric material layer 110 is formed on the substrate 100. In some embodiments, the dielectric material layer 110 covers both the first region 100A and the second region 100B of the substrate 100. In some embodiments, the dielectric material layer 110 may be a silicon oxide layer. In some embodiments, the dielectric material layer 110 is formed by a suitable deposition process, such as chemical vapor deposition (CVD), or the like.

Figure 5:
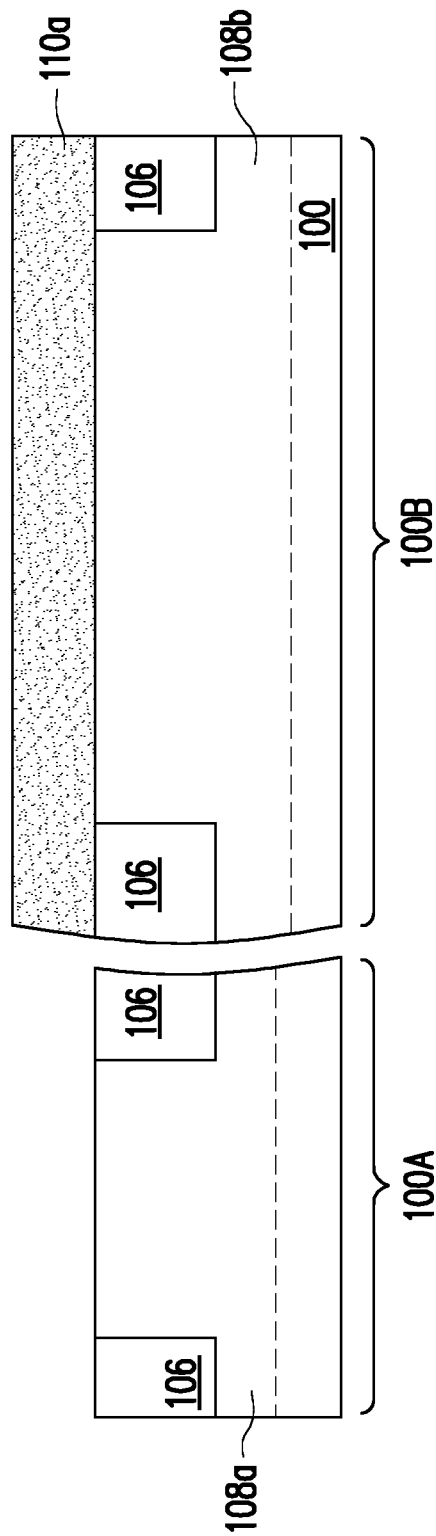

Referring to FIG. 4 and FIG. 5, a portion of the dielectric material layer 110 on the first region 100A of the substrate 100 is removed until the top surface of the first region 100A of the substrate 100 is exposed, such that a dielectric layer 100a is formed on the second region 100B of the substrate 100. In some embodiments, the dielectric layer 100a covers the second region 100B of the substrate 100, and exposes the first region 100A of the substrate 100. In some embodiments, the dielectric layer 100a is formed by photolithograph and etching processes.

Figure 6:
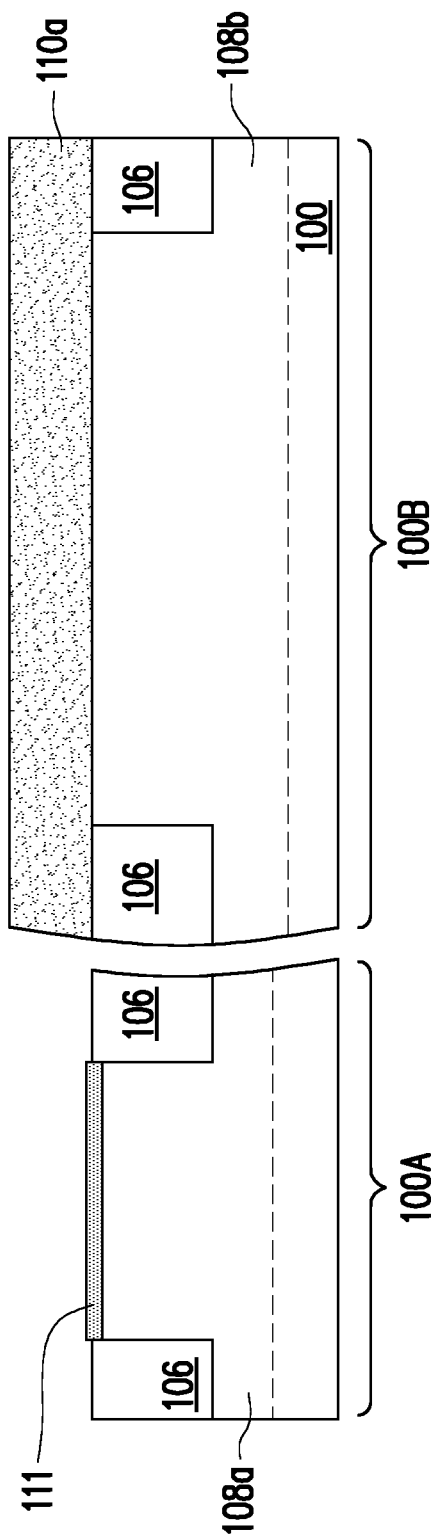

Referring to FIG. 5 and FIG. 6, an interfacial material layer 111 is formed on the first region 100A of the substrate 100. In some embodiments, the interfacial material layer 111 may be a silicon oxide layer. In some embodiments, the interfacial material layer 111 may be formed by an oxidation process. For example, the interfacial material layer 111 may be formed by oxidizing the exposed portion of the substrate 100 through thermal oxidation or chemical oxidation. Since the second region 100B of the substrate 100 is covered by the dielectric layer 110a, the interfacial material layer 111 is formed on the first region 100A of the substrate 100, without being formed on the second region 100B of the substrate 100. In some embodiments, the interfacial material layer 111 may be adapted to provide a good interface between the substrate 100 and the subsequently formed high-k dielectric material layer 112 (shown in FIG. 7).

Figure 7:
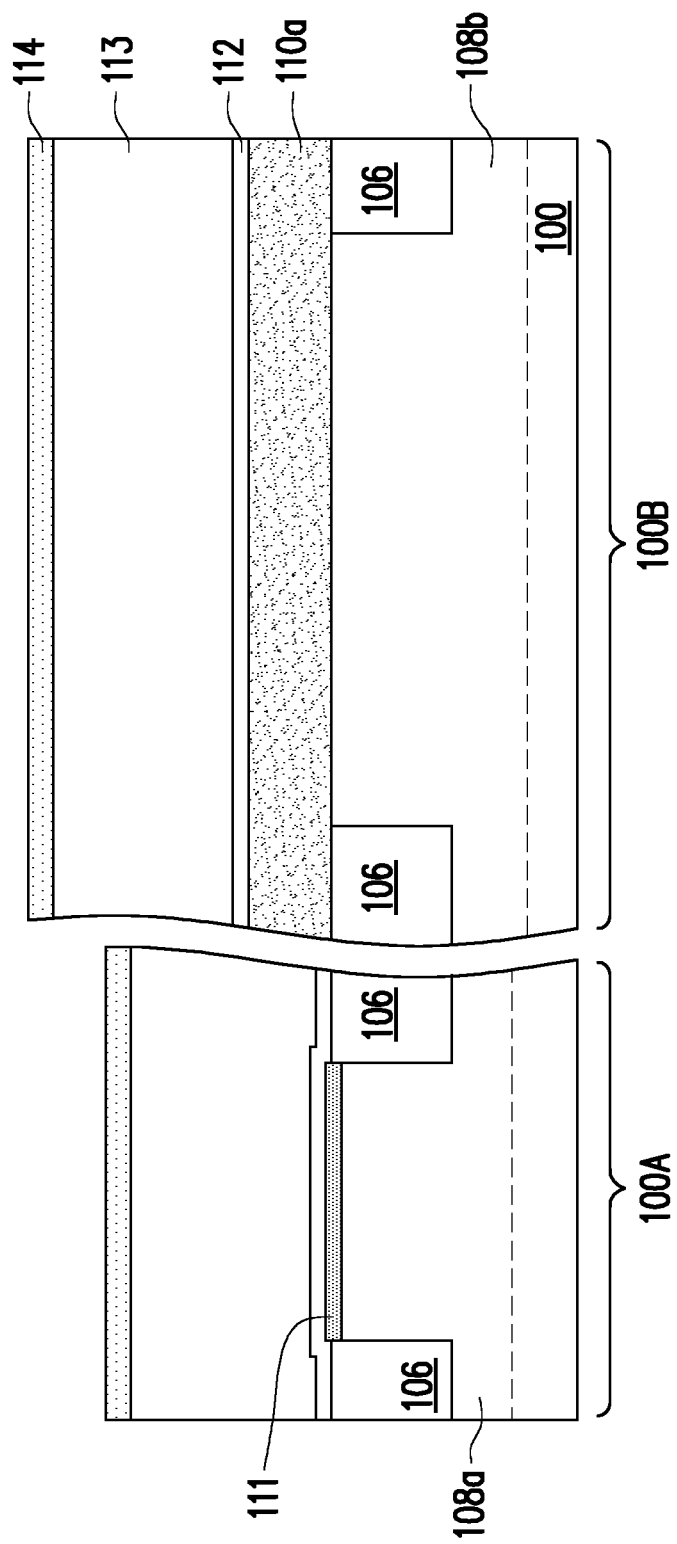

Referring to FIG. 6 and FIG. 7, a high-k dielectric material layer 112, a dummy poly gate material layer 113 and a hard mask material layer 114 are formed over the substrate 100 in sequence by suitable deposition processes, such as CVD, physical vapor deposition (PVD) or the like, or combinations thereof. The high-k dielectric material layer 112 may have a dielectric constant greater than about 4, greater than about 12, greater than about 16, or even greater than about 20. For example, the high-k dielectric material layer 112 may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In some alternative embodiments, the high-k dielectric material layer 112 may optionally include a silicate such as HfSiO, HfSiON LaSiO, AlSiO, a combination thereof, or a suitable material. The dummy poly gate material layer 113 may include polysilicon. The hard mask material layer 114 may include silicon nitride, silicon oxynitride, or the like. In some embodiments, the high-k dielectric material layer 112, the dummy poly gate material layer 113 and the hard mask material layer 114 cover the interfacial material layer 111 and the dielectric layer 110a.

Figure 8:
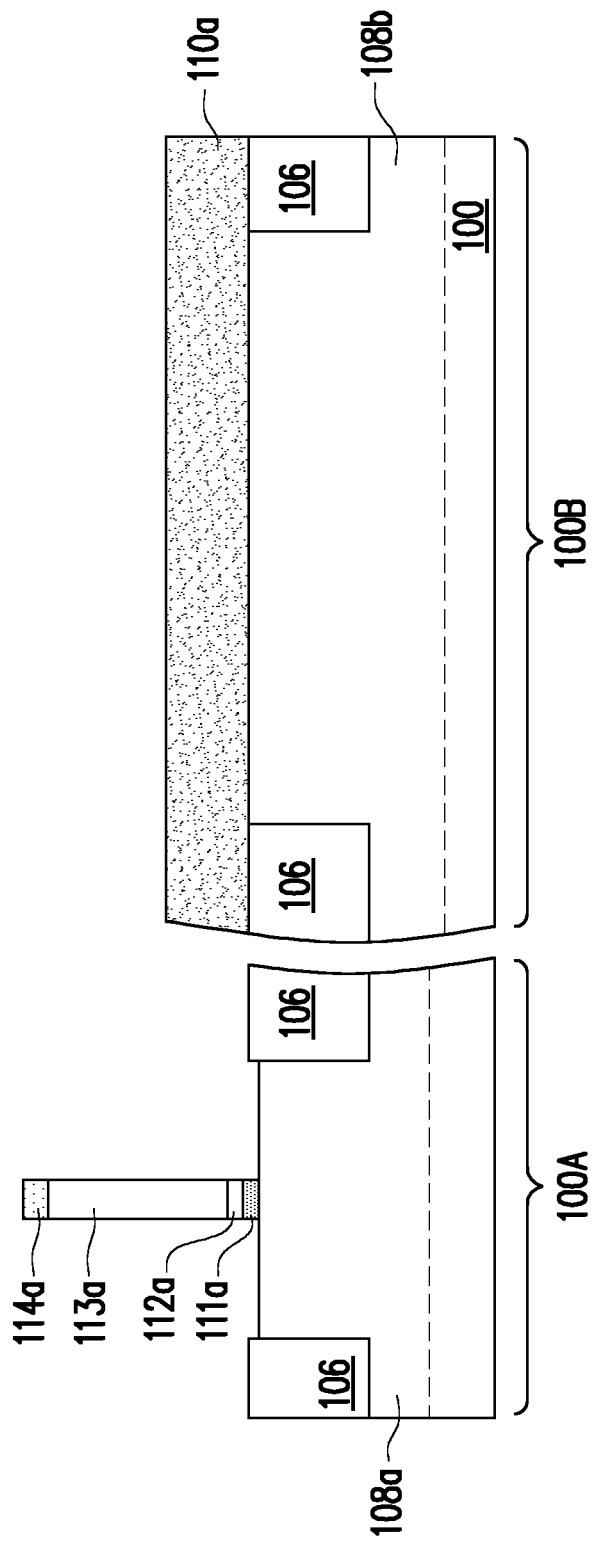

Referring to FIG. 7 and FIG. 8, the interfacial material layer 111, the high-k dielectric material layer 112, the dummy poly gate material layer 113 and the hard mask material layer 114 are patterned to form an interfacial layer 111a, a high-k dielectric layer 112a, a dummy poly gate electrode 113a and a hard mask layer 114a stacked in sequence over the first region 100A of the substrate 100. The high-k dielectric layer 112a is disposed on the interfacial layer 111a. The dummy poly gate electrode 113a is disposed on the high-k dielectric layer 112a. The hard mask layer 114a is disposed on the dummy poly gate electrode 113a. The patterning process may include photolithograph and etching processes. After the patterning process of the interfacial material layer 111, the high-k dielectric material layer 112, the dummy poly gate material layer 113 and the hard mask material layer 114, the top surface of the dielectric layer 110a are exposed.

Figure 9:
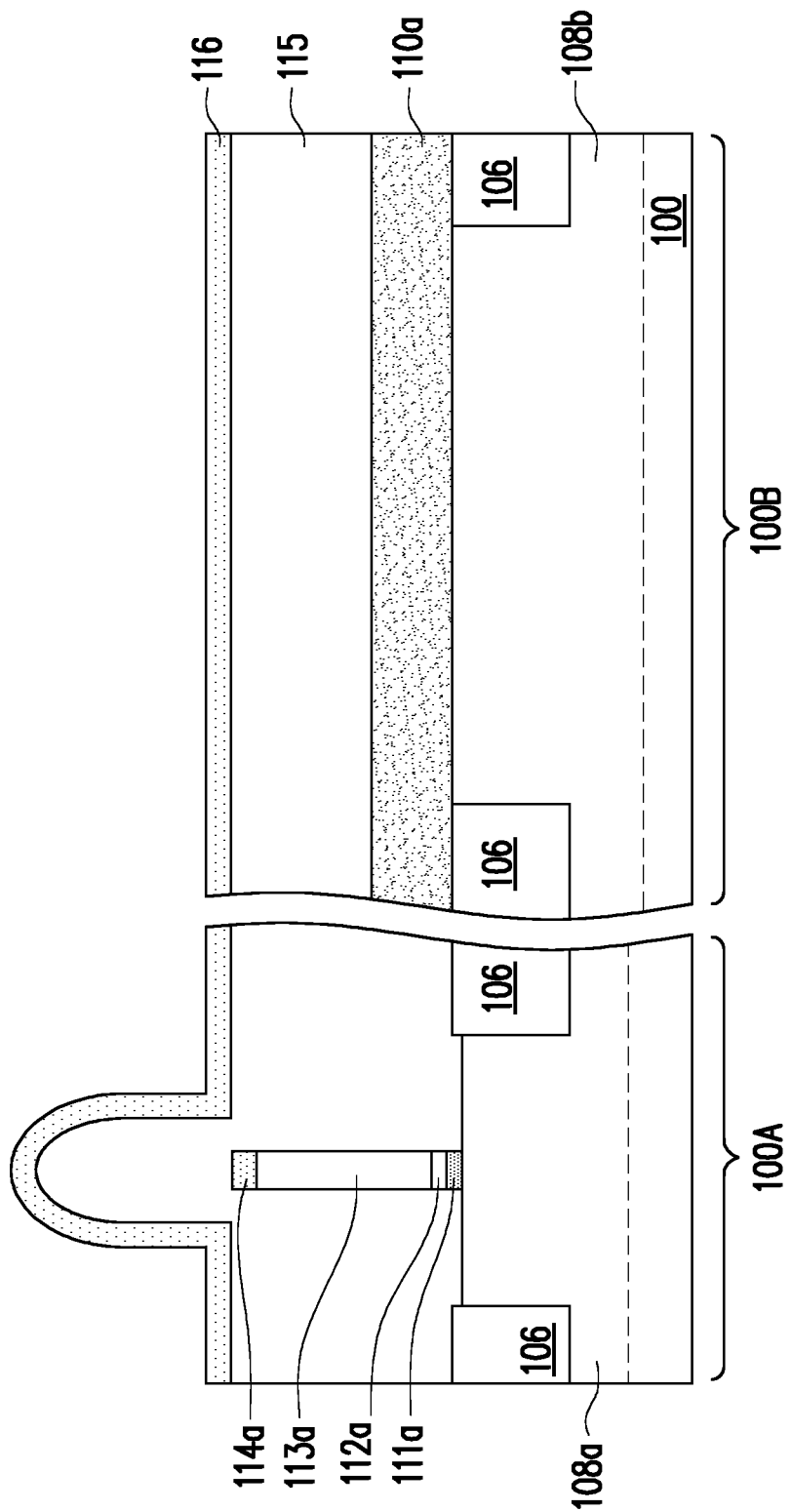

Referring to FIG. 8 and FIG. 9, a poly gate material layer 115 and a hard mask material layer 116 are formed over the substrate 100 in sequence by suitable deposition processes, such as CVD, PVD or the like, or combinations thereof. The poly gate material layer 115 may include polysilicon. The hard mask material layer 116 may include silicon nitride, silicon oxynitride, or the like. In some embodiments, the poly gate material layer 115 and the hard mask material layer 116 cover the interfacial layer 111a, the high-k dielectric layer 112a, the dummy poly gate electrode 113a, the hard mask layer 114a and the dielectric layer 110a.

Figure 10:
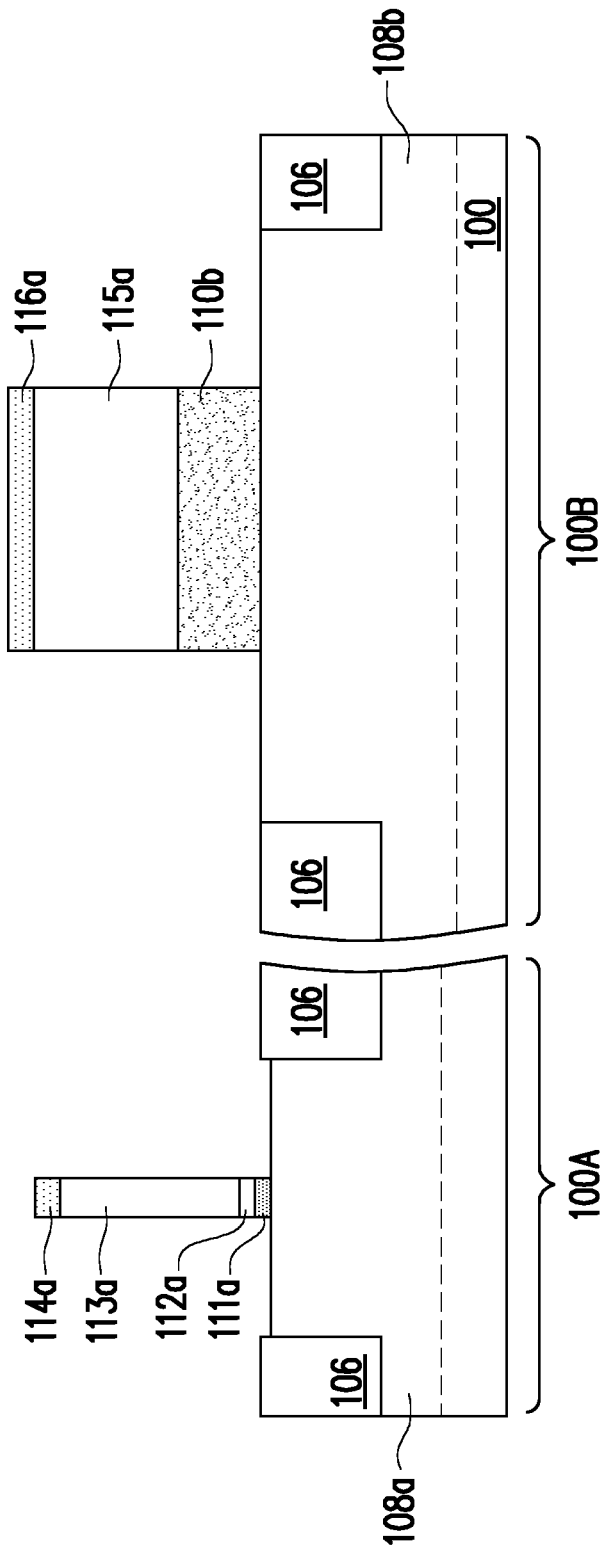

Referring to FIG. 9 and FIG. 10, the dielectric layer 110a, the poly gate material layer 115 and the hard mask material layer 116 are patterned to form a gate dielectric layer 110b, a poly gate electrode 115a and a hard mask layer 116a stacked in sequence over the second region 100B of the substrate 100. The poly gate electrode 115a is disposed on the gate dielectric layer 110b. The hard mask layer 116a is disposed on the poly gate electrode 115a. The patterning process may include photolithograph and etching processes. In some embodiments, the gate dielectric layer 110b is referred to as a gate oxide layer. After the patterning process of the dielectric layer 110a, the poly gate material layer 115 and the hard mask material layer 116, the top surface of hard mask layer 114a is exposed, and sidewalls of the interfacial layer 111a, the high-k dielectric layer 112a, the dummy poly gate electrode 113a and the hard mask layer 114a are also exposed. In some embodiments, the dummy poly gate electrode 113a is formed before the poly gate electrode 115a is formed. However, in some alternative embodiments, the dummy poly gate electrode 113a may be formed after the poly gate electrode 115a is formed. The disclosure is not limited thereto.

Figure 11:
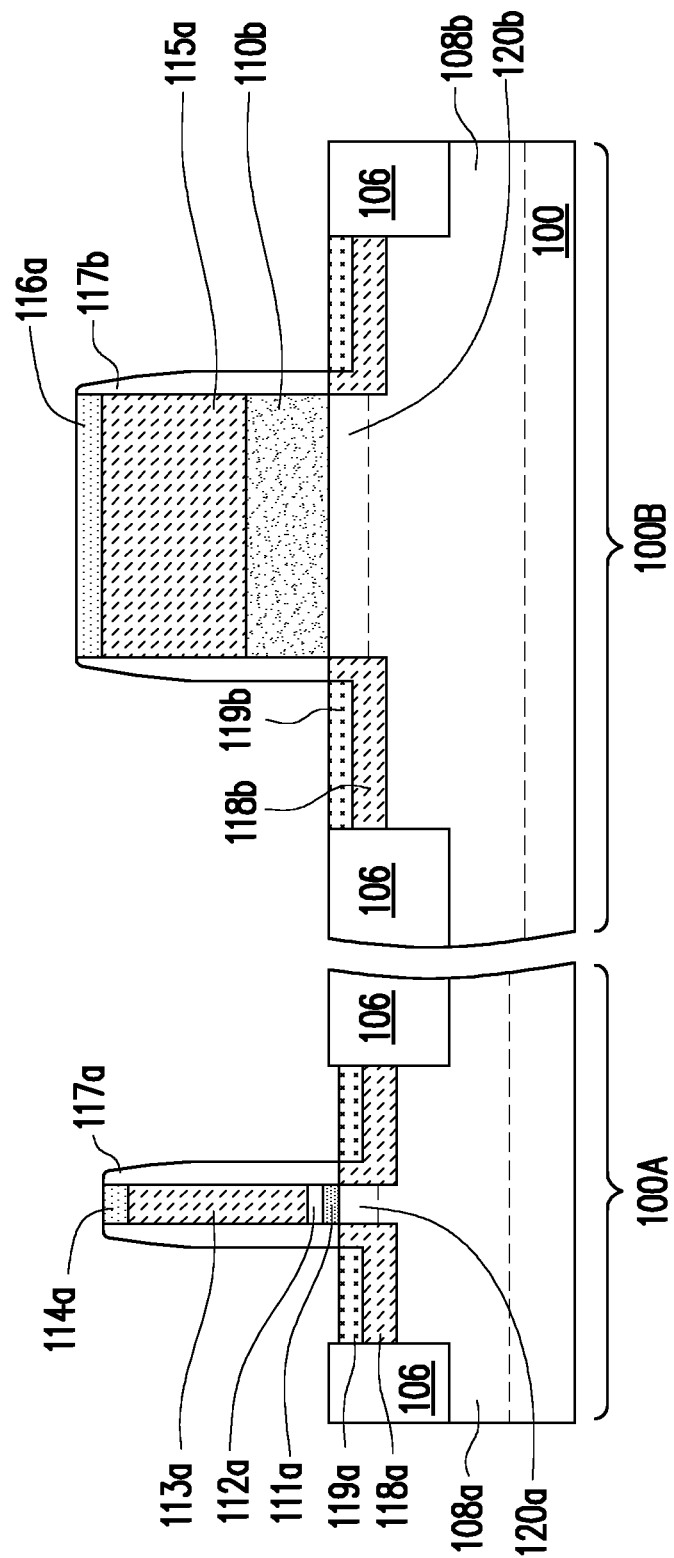

Referring to FIG. 10 and FIG. 11, spacers 117a and 117b are formed. The spacer 117a is formed on sidewalls of the interfacial layer 111a, the high-k dielectric layer 112a, the dummy poly gate electrode 113a and the hard mask layer 114a. The spacers 117b are formed on sidewalls of the gate dielectric layer 110b, the poly gate electrode 115a and the hard mask layer 116a. In some embodiments, a spacer material layer (not shown) is formed over the substrate 100 to cover top surfaces of the hard mask layers 114a and 116a and sidewalls of the interfacial layer 111a, the high-k dielectric layer 112a, the dummy poly gate electrode 113a, the hard mask layer 114a, the gate dielectric layer 110b, the poly gate electrode 115a and the hard mask layer 116a. Thereafter, an etching process, such as etching back process, may be performed to remove horizontal portions of the spacer material layer, thereby forming the spacers 117a and 117b. In some embodiments, materials of the spacers 117a, 117b and materials of the hard mask layers 114a, 116a may be different or the same. In some embodiments, materials of the spacers 117a, 117b include silicon oxide, silicon nitride, or the like.

In some embodiments, one or more implantation processes may be performed to form source/drain (S/D) regions 118a and 118b in the substrate 100. The S/D regions 118a are formed in the first region 100A of the substrate 100 and are located at two opposite sides of the gate stacked structure which includes the interfacial layer 111a, the high-k dielectric layer 112a, the dummy poly gate electrode 113a and the hard mask layer 114a. The S/D regions 118b are formed in the second region 100B of the substrate 100 and are located at two opposite sides of the gate stacked structure which includes the gate dielectric layer 110b, the poly gate electrode 115a and the hard mask layer 116a. The source/drain regions 118a and 118b may be formed successively or simultaneously. The dopants for the source/drain regions 118a, 118b may be of opposite conductive type as that of the corresponding well regions 108a, 108b, respectively. For example, when the well region 108a or 108b is an n-type well, and the corresponding source/drain regions 108a or 108b may be doped with p-type dopants (e.g., boron or $BF_2^+$). Similarly, when the well region 108a or 108b is a p-type well, and the corresponding source/drain regions 108a or 108b may be doped with n-type dopants (e.g., phosphorous or arsenic). In some embodiments, the dopant concentrations and/or the depths of the source/drain regions 108a and the source/drain regions 108b may be the same or different. In some embodiments, an annealing process may be further performed to anneal the source/drain regions 108a and 108b in the substrate 100 such that the dopant (or implanted ion) may diffuse. In some embodiments, the dummy poly gate electrode 113a and the poly gate electrode 115a are also doped during the one or more implantation processes of the S/D regions 118a and 118b.

In some embodiments, channels 120a and 120b are respectively defined in the substrate 100. The channel 120a is located in the first region 100A of the substrate 100, underlies the interfacial layer 111a, and extends from one of the S/D regions 118a to the other of the S/D regions 118a. The channel 120b is located in the second region 100B of the substrate 100, underlies the gate dielectric layer 110b, and extends from one of the S/D regions 118b to the other of the S/D regions 118b.

In some embodiments, a self-aligned silicide (salicide) process is performed to form metal silicide layers 119a and 119b respectively on the S/D regions 118a and 118b. In some embodiments, the metal silicide layers 119a and 119b include nickel silicide (NiSi), cobalt silicide (CoSi), titanium silicide (TiSi), tungsten silicide (WSi), molybdenum silicide (MoSi), platinum silicide (PtSi), palladium silicide (PdSi), CoSi, NiCoSi, NiPtSi, Ir, PtIrSi, ErSi, YbSi, PdSi, RhSi, or NbSi, or combinations thereof. In some embodiments, a metal layer (not shown) is formed over the substrate 100 to at least cover the S/D regions 118a and 118b. Thereafter, an annealing process is performed such that the metal layer is reacted with the S/D regions 118a and 118b, so as to form the metal silicide layers 119a and 119b. The unreacted metal layer is then removed.

Figure 12:
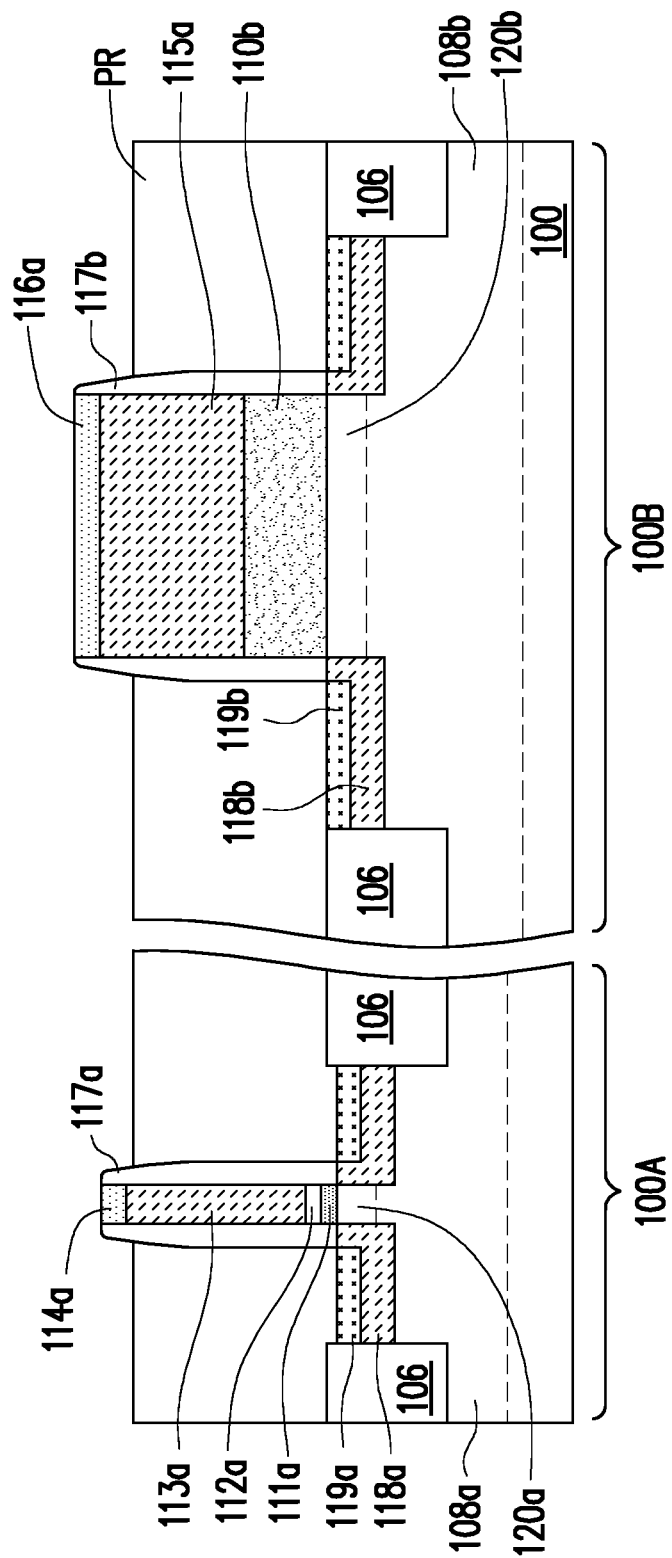

Referring to FIG. 11 and FIG. 12, a photoresist material layer (not shown) is formed over the substrate 100 to cover the semiconductor structure shown in FIG. 11. The photoresist material layer may be formed by, for example, a spin coating process. Thereafter, the photoresist material layer is partially removed by, for example, an etching back process to form a photoresist layer PR exposing the hard mask layer 114a and the hard mask layer 116a. In some embodiments, upper portions of the spacers 117a and 117b are also exposed by the photoresist layer PR. In some embodiments, a top surface of the photoresist layer PR is lower than the top surfaces of the hard mask layer 114a and the hard mask layer 116a.

Figure 13:
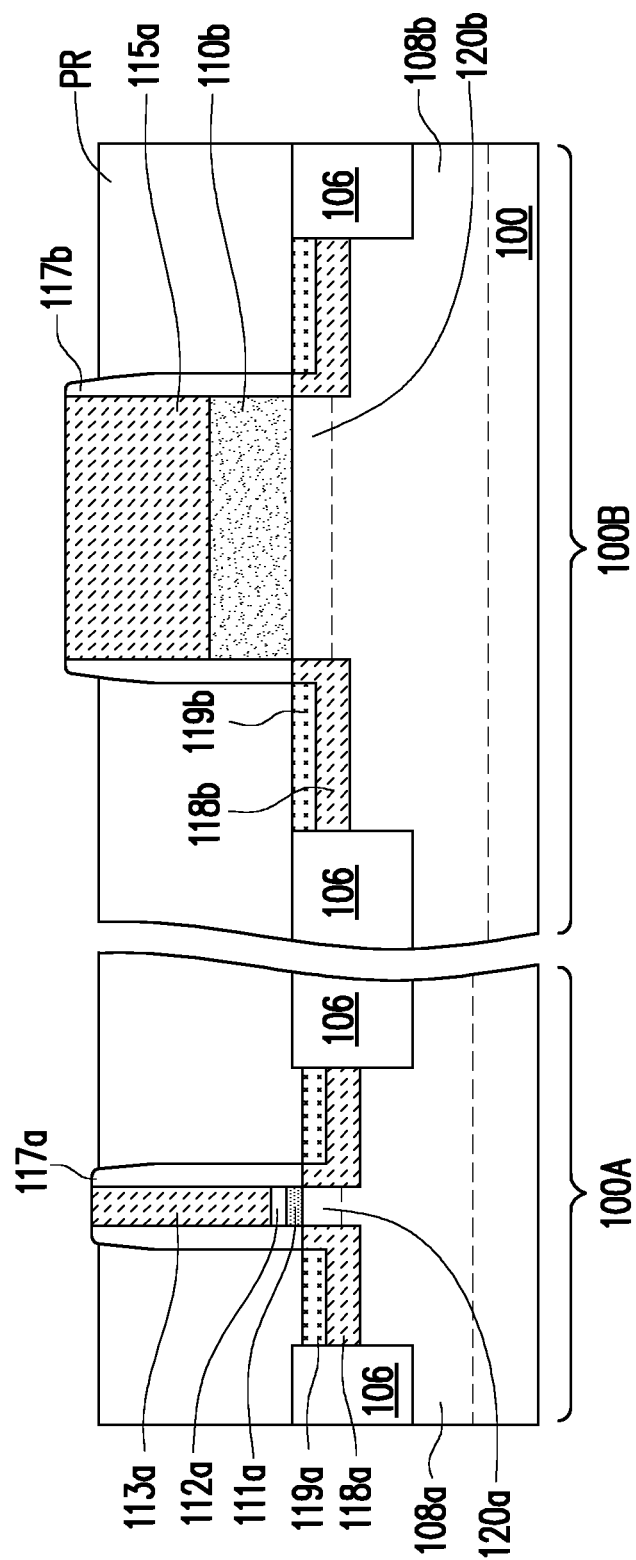

Referring to FIG. 12 and FIG. 13, the hard mask layer 114a and the hard mask layer 116a are removed, such that the top surface of the dummy poly gate electrode 113a and the top surface of the poly gate electrode 115a are exposed. In some embodiments, the hard mask layer 114a and the hard mask layer 116a are removed by an etching process using the photoresist layer PR as an etching mask. In some embodiments, portions of the spacers 117a and 117b are also removed. In some embodiments, topmost ends of the spacers 117a are substantially levelled with the top surface of the dummy poly gate electrode 113a, and/or topmost ends of the spacers 117b are substantially levelled with the top surface of the poly gate electrode 115a. In some alternative embodiments, topmost ends of the spacers 117a are lower or higher than the top surface of the dummy poly gate electrode 113a, and/or topmost ends of the spacers 117b are lower or higher than the top surface of the poly gate electrode 115a.

Figure 14:
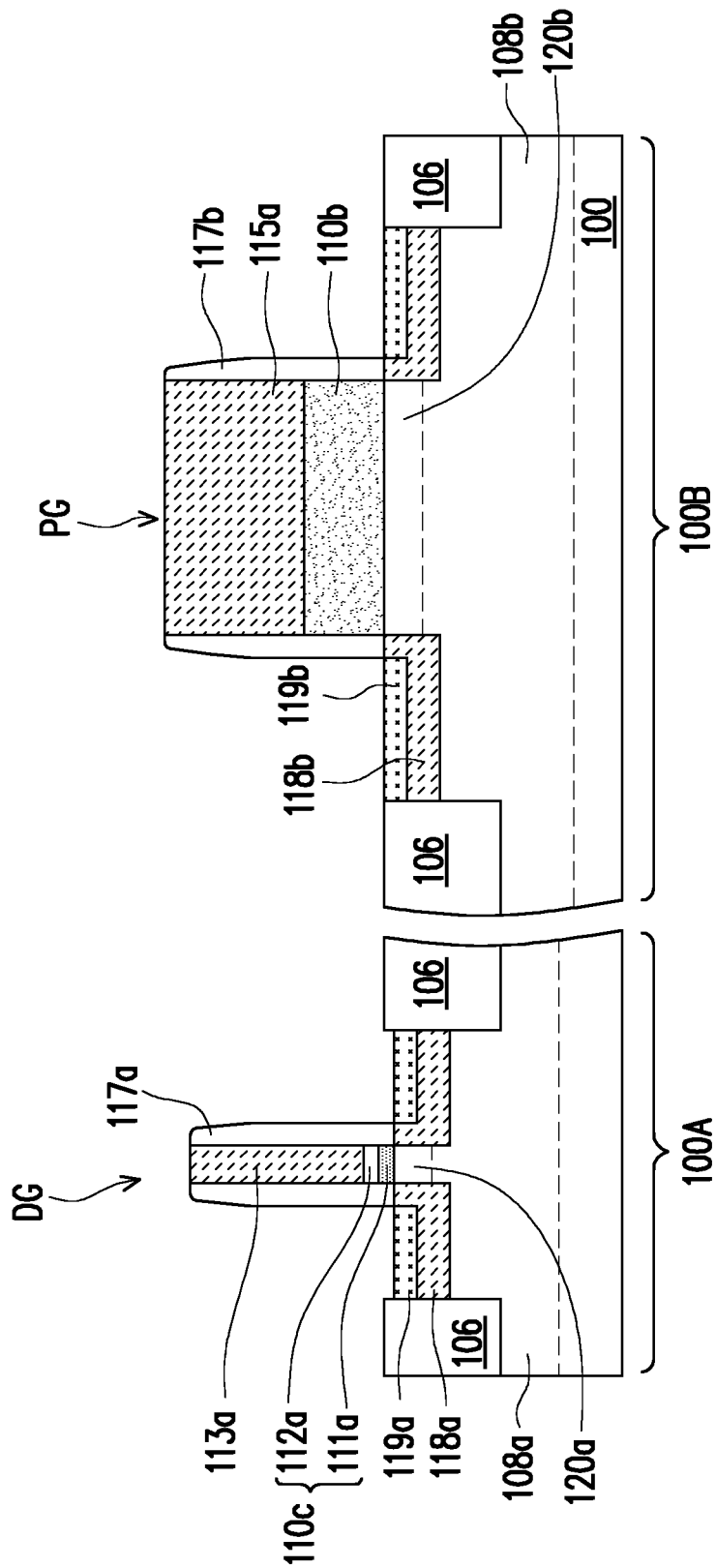

Referring to FIG. 13 and FIG. 14, the photoresist layer PR is then removed by, for example, a stripping process or an ashing process. As shown in FIG. 14, the interfacial layer 111a, the high-k dielectric layer 112a, the dummy poly gate electrode 113a and the spacers 117a constitute a dummy poly gate DG. The high-k dielectric layer 112a is disposed on the interfacial layer 111a. The dummy poly gate DG is disposed on the high-k dielectric layer 112a. The spacers 117a cover the sidewalls of the interfacial layer 111a, the high-k dielectric layer 112a and the dummy poly gate electrode 113a. The interfacial layer 111a and the high-k dielectric layer 112a may be collectively referred to as a gate dielectric layer 110c of the dummy poly gate DG.

The gate dielectric layer 110b (e.g., gate oxide layer), the poly gate electrode 115a and the spacers 117b constitute a poly gate PG. The poly gate electrode 115a is disposed on the gate dielectric layer 110b. The spacers 117b cover the sidewalls of the dielectric layer 110b and the poly gate electrode 115a. The thickness of the gate dielectric layer 110b is larger than the thickness of the gate dielectric layer 110c. It is noted that no high-k dielectric layer is sandwiched between the poly gate electrode 115a and the gate dielectric layer 110b (e.g., gate oxide layer), and the poly gate electrode 115a is formed in contact with the gate dielectric layer 110b. Therefore, the poly gate PG may not suffer fermi-level pinning issue caused by the worse interface between the poly gate electrode and the high-k dielectric layer.

Figure 15:
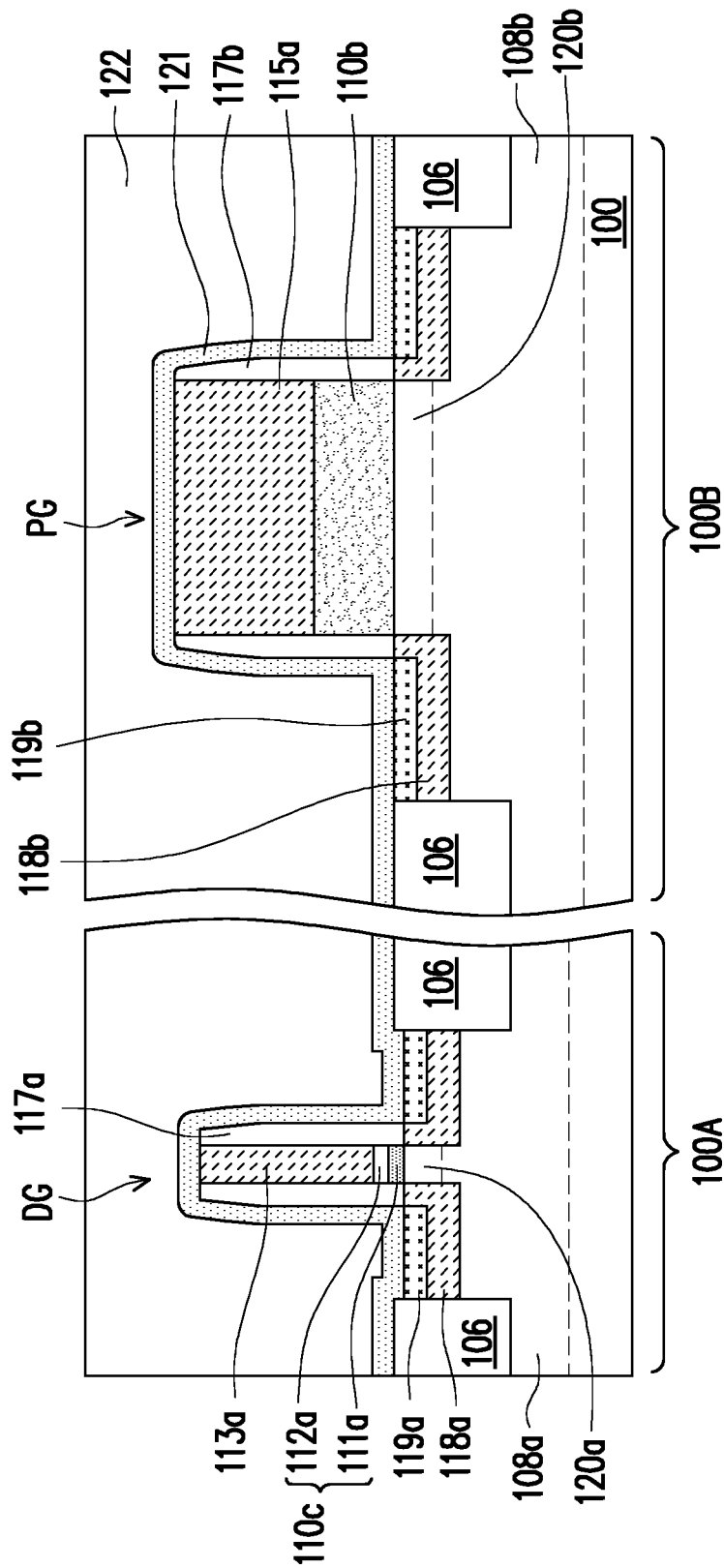

Referring to FIG. 14 and FIG. 15, an etching stop material layer 121 is formed over the substrate 100 to cover the dummy poly gate DG, the poly gate PG, the S/D regions 118a, 118b, the metal silicide layers 119a, 119b and the isolation structures 106. In some embodiments, the etching stop material layer 121 is referred to as a contact etch stop layer (CESL). The etching stop material layer 121 may be formed by atomic layer deposition (ALD), CVD, plasma-enhanced CVD (PECVD), high density plasma CVD (HDPCVD), or other suitable methods. Subsequently, an interlayer dielectric material layer 122 is formed on the etching stop material layer 121. The interlayer dielectric material layer 122 may be formed by CVD, PECVD, HDPCVD, flowable CVD (FCVD), spin coating, or other suitable methods. The etching stop material layer 121 and the interlayer dielectric material layer 122 may be made of different materials. In some embodiments, the etching stop material layer 121 includes SiN, SiC, SiOC, SiON, SiCN, SiOCN, or the like, or combinations thereof. In some embodiments, the interlayer dielectric material layer 122 includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the interlayer dielectric material layer 122 may include low-k dielectric material with a dielectric constant lower than 4, extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The interlayer dielectric material layer 122 may be a single layer structure or a multi-layer structure.

Figure 16:
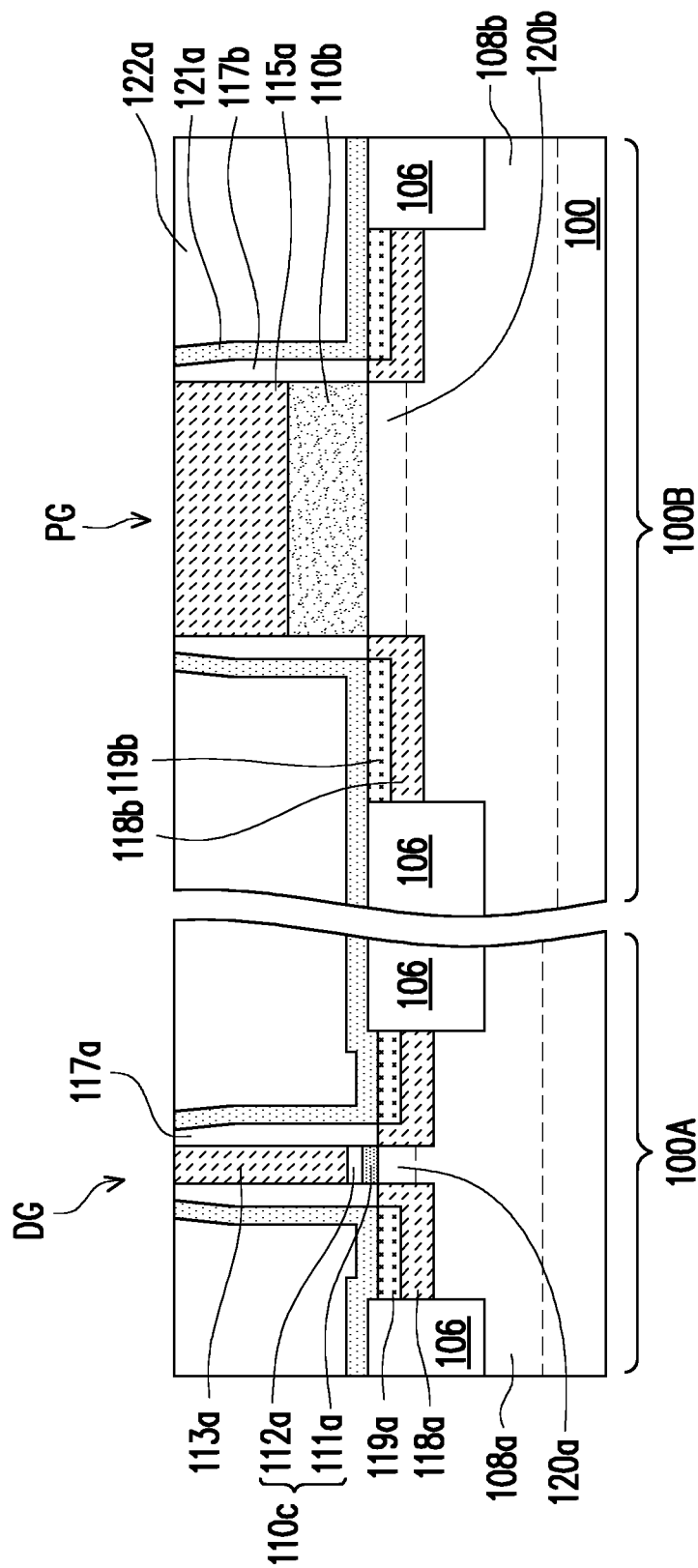

Referring to FIG. 15 and FIG. 16, a planarization process is performed to remove portions of etching stop material layer 121 and the interlayer dielectric material layer 122 until the top surfaces of the dummy poly gate DG and the poly gate PG are exposed, so as to form an etching stop layer 121a and an interlayer dielectric layer 122a on the etching stop layer 121a. The etching stop layer 121a may cover top surfaces of the metal silicide layers 119a, 119b and the isolation structures 106 and sidewalls of the dummy poly gate DG and the poly gate PG. The interlayer dielectric layer 122a may wrap around the dummy poly gate DG and the poly gate PG. In some embodiments, during the planarization process, upper portions of the dummy poly gate DG and/or the poly gate PG are also removed. In some embodiments, after the planarization process is performed, the top surfaces of the dummy poly gate DG and/or the poly gate PG may be substantially levelled with the top surface of the interlayer dielectric layer 122a and the topmost end of the etching stop layer 121a. The planarization process may include a chemical mechanical polishing (CMP) process.

During the planarization process of the etching stop material layer 121 and the interlayer dielectric material layer 122, the poly gate electrode 115a of the poly gate PG may be polished under a polishing rate which is much less than those of the etching stop material layer 121 and the interlayer dielectric material layer 122. Therefore, the poly gate PG may not suffer dishing issue during the planarization process.

Figure 18:
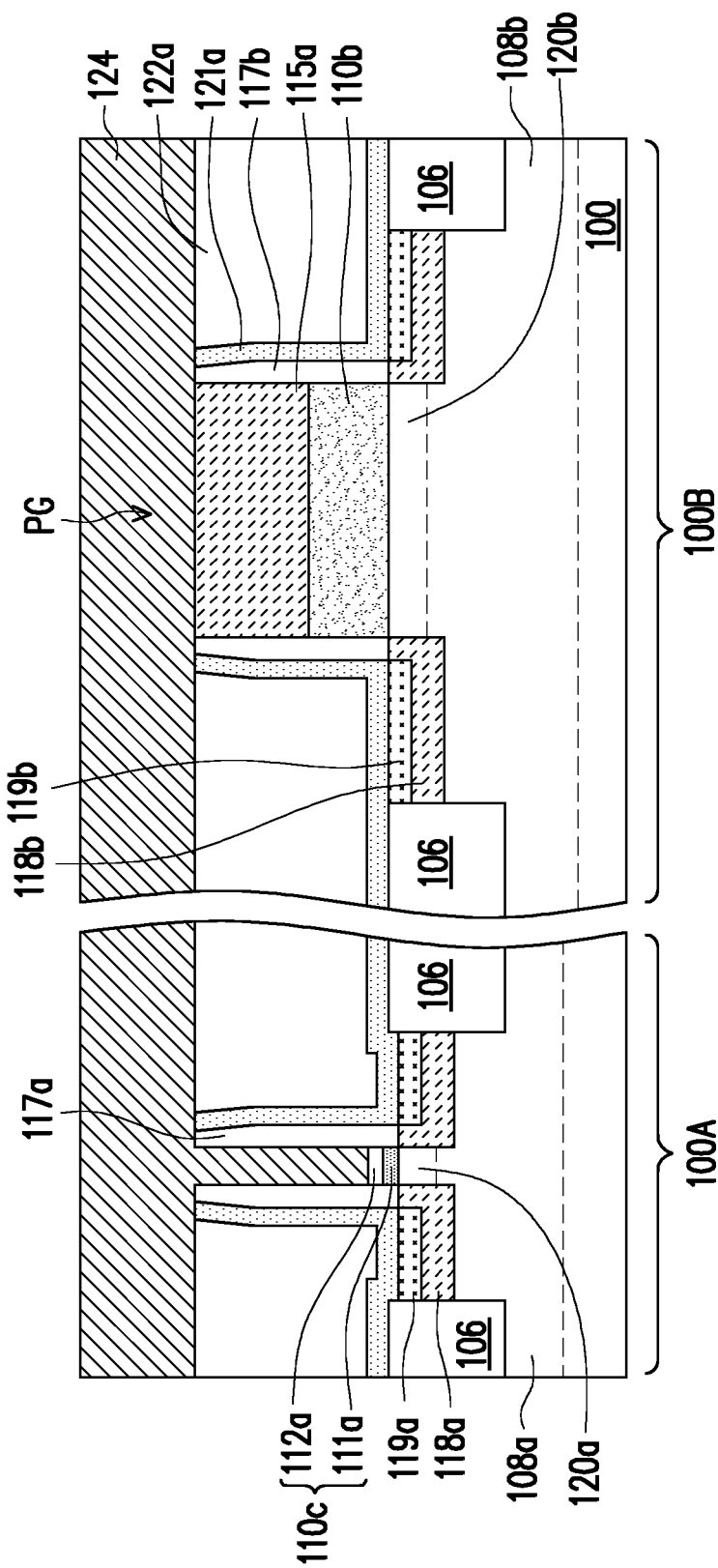
Figure 19:
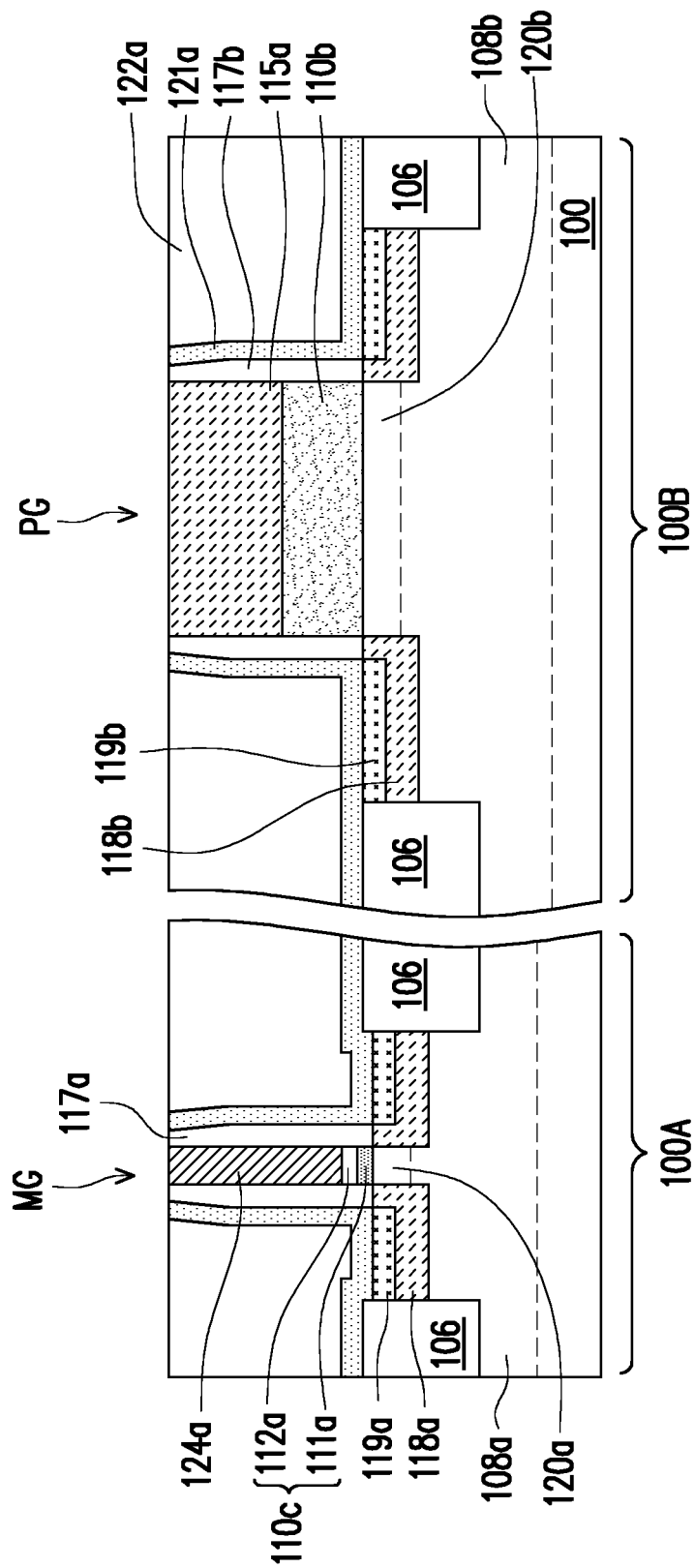

After the planarization process, a gate replacement process is performed to replace the dummy poly gate DG with a metal gate MG (shown in FIG. 19). The gate replacement process is described in accompany with FIGS. 17 through 19 in detail.

Figure 17:
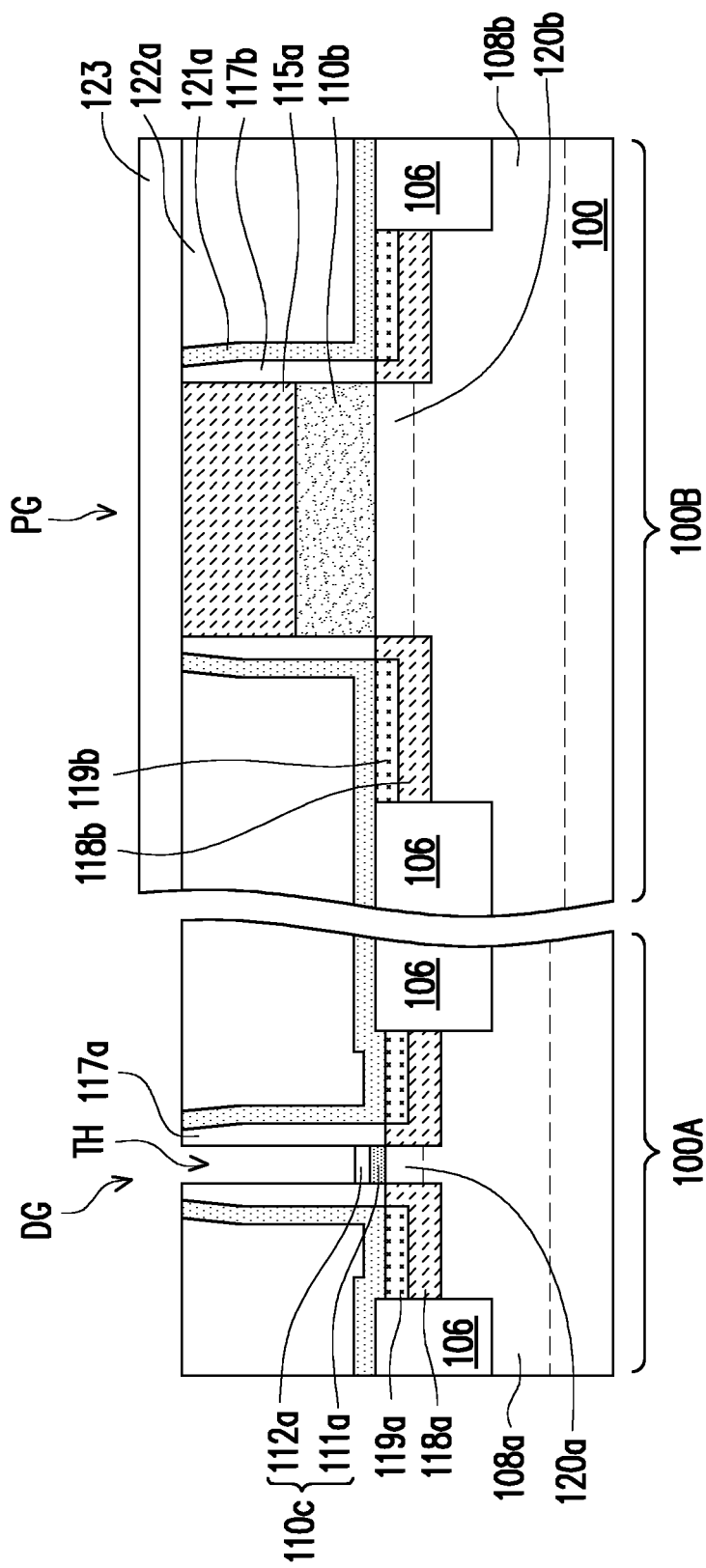

Referring to FIG. 17, a mask layer 123 may be formed over the second region 100B of the substrate 100 to cover the poly gate PG, and the top surface of the dummy poly gate DG may be exposed. In some embodiments, the mask layer 123 may include a dielectric material, such as silicon oxide, silicon nitride, or the like. The material of the mask layer 123 is merely for illustration and the disclosure is not limited thereto. Thereafter, the dummy poly gate electrode 113a is removed by an etching process until the high-k dielectric layer 112a is exposed, such that a trench TH is formed between the spacers 117a.

Referring to FIG. 17 and FIG. 18, the mask layer 123 is removed and a metal gate material layer 124 is formed over the substrate 100 to fill the trench TH. In some embodiments, the metal gate material layer 124 may entirely cover the top surfaces of the interlayer dielectric layer 122a and the poly gate PG and entirely fill the trench TH.

In some embodiments, the metal gate material layer 124 may include a work function layer (not individually illustrated) and a fill metal layer (not individually illustrated) on the work function metal layer. The work function metal layer may be an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The fill metal layer includes copper, aluminum, tungsten, or other suitable metallic materials. In some embodiments, the metal gate material layer 124 may further include a liner layer, an interface layer, a seed layer, an adhesion layer, a barrier layer, a combination thereof or the like. In some embodiments, the metal gate material layer 124 is formed by suitable processes such as ALD, CVD, PVD, plating process, or combinations thereof.

Referring to FIG. 18 and FIG. 19, a planarization process is performed to remove excess portion of the metal gate material layer 124 outside the trench TH to form a metal gate electrode 124a in the trench TH. In some embodiments, after the planarization process is performed, the top surface of the metal gate electrode 124a may be substantially levelled with the top surface of the interlayer dielectric layer 122a, the topmost end of the etching stop layer 121a, and the top surfaces of the spacers 117a, and the top surface of the poly gate electrode 115a may be substantially levelled with the top surface of the interlayer dielectric layer 122a, the topmost end of the etching stop layer 121a, and the top surfaces of the spacers 117b. The planarization process may include a chemical mechanical polishing (CMP) process. As shown in FIG. 19, the interfacial layer 111a, the high-k dielectric layer 112a, the metal gate electrode 124a and the spacers 117a constitute the metal gate MG. The high-k dielectric layer 112a is disposed on the interfacial layer 111a. The metal gate electrode 124a is disposed on the high-k dielectric layer 112a. The spacer 117a covers the sidewalls of the interfacial layer 111a, the high-k dielectric layer 112a and the metal gate electrode 124a.

During the planarization process of the metal gate material layer 124, the poly gate electrode 115a of the poly gate PG may be polished under a polishing rate which is much less than that of the metal gate material layer 124. Therefore, the poly gate PG may not suffer dishing issue during the planarization process.

It is noted that, in some embodiments, the mask layer 123 is removed before the metal gate material layer 124 is formed, which is merely for illustration, and the disclosure is not limited thereto. In alternative embodiments, the mask layer 123 is removed during the afore-mentioned planarization process of the metal gate material layer 124.

Figure 20:
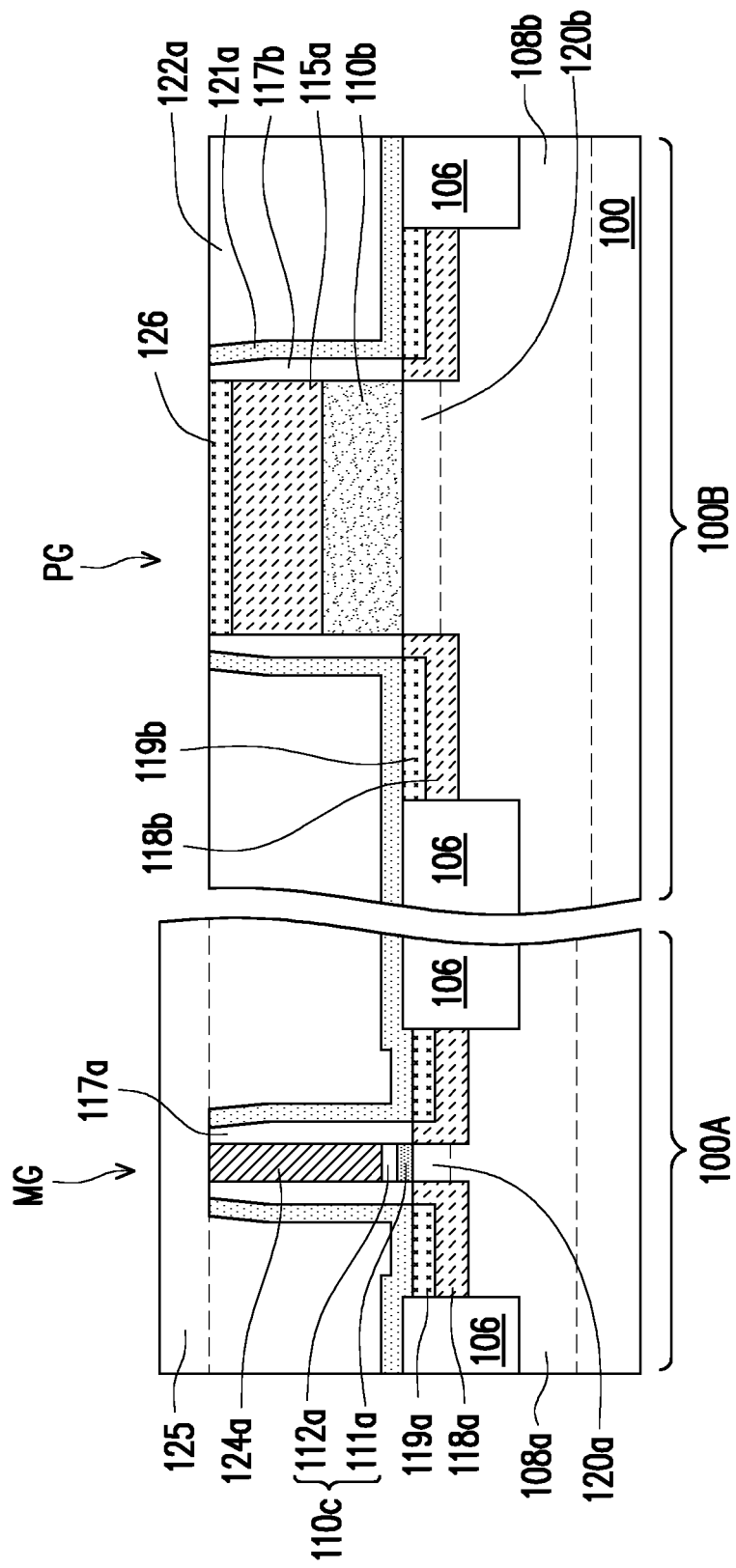

Referring to FIG. 19 and FIG. 20, a dielectric layer 125 is formed over the first region 100A of the substrate 100 to cover the metal gate MG, and the top surface of the poly gate PG may be exposed. In some embodiments, the material of the dielectric layer 125 may be similar to that of the interlayer dielectric layer 122a. Thereafter, a self-aligned silicide (salicide) process is performed to form a metal silicide layer 126 on the poly gate PG. In some embodiments, the metal silicide layer 126 includes nickel silicide (NiSi), cobalt silicide (CoSi), titanium silicide (TiSi), tungsten silicide (WSi), molybdenum silicide (MoSi), platinum silicide (PtSi), palladium silicide (PdSi), CoSi, NiCoSi, NiPtSi, Ir, PtIrSi, ErSi, YbSi, PdSi, RhSi, or NbSi, or combinations thereof. In some embodiments, a metal layer (not shown) is formed over the substrate 100 to at least cover the poly gate electrode 115a. Thereafter, an annealing process is performed such that the metal layer is reacted with the poly gate electrode 115a, so as to form the metal silicide layers 126. The unreacted metal layer is then removed.

Figure 21:
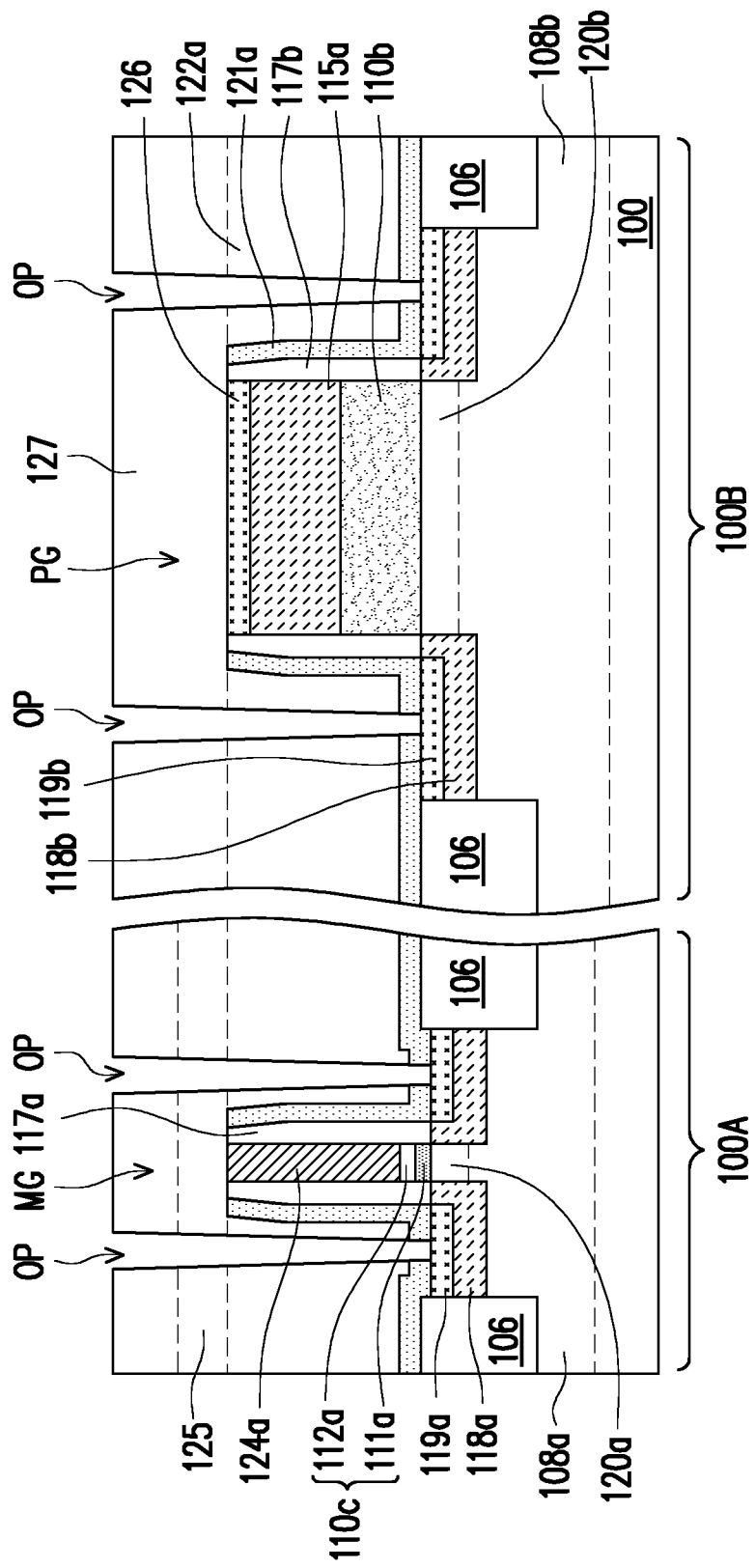

Referring to FIG. 20 and FIG. 21, an inter-layer dielectric layer 127 is formed over the substrate 100 to cover the dielectric layer 125 and the metal silicide layer 126. In some embodiments, the material of the inter-layer dielectric layer 127 may be similar to that of the interlayer dielectric layer 122a. In some embodiments, the inter-layer dielectric layer 127 and the dielectric layer 125 are made of the same material. In alternative embodiments, the inter-layer dielectric layer 127 and the dielectric layer 125 are made of different materials. In this case, the dielectric layer 125 may be removed before the inter-layer dielectric layer 127 is formed. After the inter-layer dielectric layer 127 is formed, the inter-layer dielectric layer 127, the dielectric layer 125, the interlayer dielectric layer 122a and the etching stop layer 121a are patterned to form a plurality of through openings OP penetrating through these layers. Some of the through openings OP may expose the respective metal silicide layers 119a or 119b. Some of the through openings OP may expose the metal gate MG or the poly gate PG (not shown in the cross-sectional view of FIG. 21).

Figure 22:
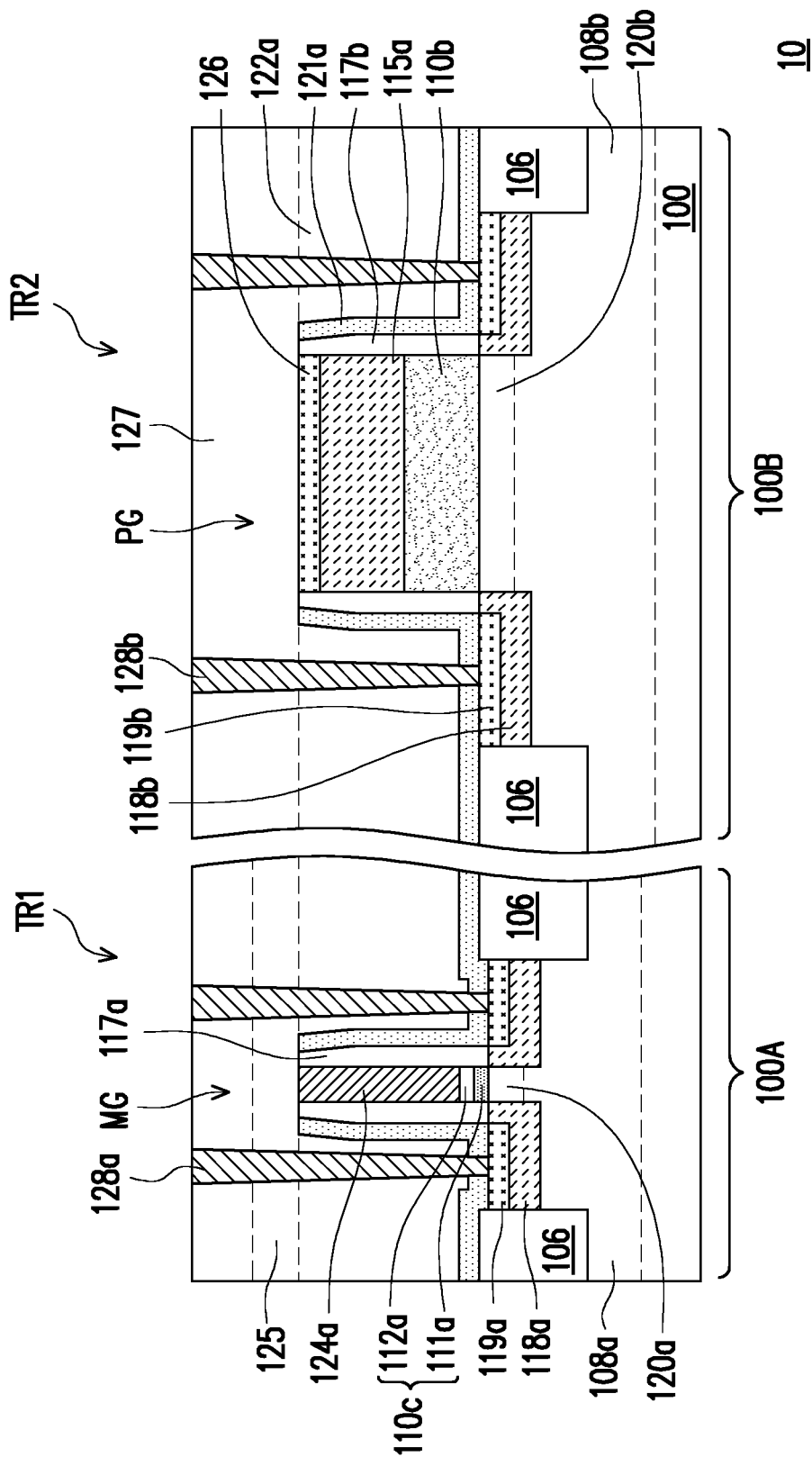

Referring to FIG. 21 and FIG. 22, a contact conductive material (not shown) is filled into the through openings OP and covers the inter-layer dielectric layer 127. A planarization process is then performed to remove excess contact conductive material outside the through openings OP, such that a plurality of source/drain contacts 128a and 128b and gate contacts (not shown in the cross-sectional view of FIG. 22) are formed in the through openings OP. The source/drain contacts 128a are formed on the metal silicide layer 119a to electrically connect to the S/D regions 118a. The source/drain contacts 128b are formed on the metal silicide layer 119b to electrically connect to the S/D regions 118b. The gate contacts are formed to electrically connect to the metal gate MG or the poly gate PG. In some embodiments, each of the source/drain contacts 128a, 128b and the gate contacts includes a barrier layer (not individually illustrated) and a conductive layer (not individually illustrated) on the barrier layer. The barrier layer may surround sidewalls and/or bottom surface of the conductive layer. The barrier layer may include titanium, tantalum, titanium nitride, tantalum nitride, manganese nitride or combinations thereof. The conductive layer may include metal, such as tungsten (W), copper (Cu), Ru, Ir, Ni, Os, Rh, Al, Mo, Co, alloys thereof, combinations thereof or any metallic material with suitable resistance and gap-fill capability. In some embodiments, the top surfaces of the source/drain contacts 128a, 128b and the gate contacts are substantially levelled with the top surface of the inter-layer dielectric layer 127. It is understood that the semiconductor device of the disclosure may be formed by CMOS technology processing, and thus some processes are not described in detail herein.

As shown in FIG. 22, a semiconductor device 10 including a first transistor TR1 and a second transistor TR2 is formed. The first transistor TR1 is disposed in/on the first region 100A of the substrate 100 and includes the metal gate MG, the S/D regions 118a and the channel 120a. The second transistor TR2 is disposed in/on the second region 100B of the substrate 100 and includes the poly gate PG, the S/D regions 118b and the channel 120b. The metal gate MG is located on the first region 100A of the substrate 100. The S/D regions 118a are located in the first region 100A of the substrate 100 and at opposite sides of the metal gate MG. The channel 120a is located in the first region 100A of the substrate 100 and underlies the metal gate MG. The poly gate PG is located on the second region 100B of the substrate 100. The S/D regions 118b are located in the second region 100B of the substrate 100 and at opposite sides of the poly gate PG. The channel 120b is located in the second region 100B of the substrate 100 and underlies the poly gate PG. An aspect ratio of the poly gate PG is less than that of the metal gate MG. A gate area of the poly gate PG is greater than that of the metal gate MG. A channel length of the channel 120b is greater than that of the channel 120a. For example, the gate area of the poly gate PG may be greater than about 2 μm², such as about 5 μm² or about 10 μm². The gate area of the metal gate MG may be less than or equal to about 2 μm² or about 1 μm². The channel length of the channel 120b may be greater than about 0.1 μm, or other suitable values. The channel length of the channel 120a may be less than or equal to about 0.05 μm, or other suitable values.

In some embodiments, the first transistor TR1 with smaller gate area (or shorter channel length) may serve as a core device configured to aid in core functions for the IC. For example, the first transistor TR1 and other core devices (not shown) may collectively implement core circuitry for the IC. In some embodiments, the second transistor TR2 with larger gate area (or longer channel length) and thick gate oxide layer may serve as a high-voltage device configured to operate at a high operation voltage relative to the core device. The high voltages may, for example, range from about 20 to about 50 volts, about 10 to about 100 volts, about 30 to about 70 volts, or some other suitable high voltages.

Although not illustrated, the semiconductor device 10 may further include a third transistor which serves as an I/O device disposed in/on a third region of the substrate 100. A gate area (or channel length) of the I/O device may be greater than that of the first transistor TR1, and less than that of the second transistor TR2. Materials and forming method of the I/O device may be similar to those of the first transistor TR1 expect that the metal gate of the I/O device includes a gate oxide layer instead of an interfacial layer. That is, the gate dielectric layer of the I/O device includes the gate oxide layer and a high-k dielectric layer on the gate oxide layer. Materials and forming method of the gate oxide layer of the I/O device may be similar to those of the gate dielectric layer 110b of the second transistor TR2, so the detailed descriptions are not repeated for the sake of brevity.

In view of the above, in some embodiments of the disclosure, since the poly gate serves as the gate structure having larger gate area, the dishing issue is avoided due to the high selectivity of the poly gate electrode during the planarization process. Therefore, the reliability and performance of the device are accordingly improved. Furthermore, the manufacturing process of the semiconductor device is compatible to HKMG process.

In accordance with some embodiments of the disclosure, a semiconductor device includes a substrate, a metal gate and a poly gate. The substrate includes a first region and a second region. The metal gate is disposed on the first region of the substrate. The poly gate is disposed on the second region of the substrate. A gate area of the poly gate is greater than that of the metal gate.

In accordance with some embodiments of the disclosure, a semiconductor device includes a substrate, a metal gate, a first channel, a poly gate and a second channel. The substrate includes a first region and a second region. The metal gate is disposed on the first region of the substrate. The first channel is located in the first region of the substrate and underlies the metal gate. The poly gate is disposed on the second region of the substrate. The second channel is located in the second region of the substrate and underlies the poly gate. A channel length of the second channel is greater than that of the first channel.

In accordance with some embodiments of the disclosure, a method of forming a semiconductor device includes the following steps. A substrate including a first region and a second region is provided. A dummy poly gate is formed on the first region of the substrate. A poly gate is formed on the second region of the substrate. The dummy poly gate is replaced with a metal gate. A gate area of the poly gate is greater than that of the metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising an isolation structure, a first region and a second region, wherein the first region is spaced apart from the second region by the isolation structure;
a metal gate disposed on the first region of the substrate, wherein the metal gate comprises a multi-layered gate dielectric layer and a metal gate electrode on the multi-layered gate dielectric layer;
a poly gate disposed on the second region of the substrate, wherein the poly gate comprises a gate dielectric layer and a poly gate electrode on the gate dielectric layer, wherein the gate dielectric layer is thicker than the multi-layered gate dielectric layer, and a gate area of the poly gate is greater than that of the metal gate; and
a bottom-most surface of the multi-layered gate dielectric layer is vertically offset from a bottom surface of the gate dielectric layer, a bottom surface of the metal gate electrode and a bottom surface of the poly gate electrode, in a direction orthogonal to a top surface of the substrate at a first height, a second height and a third height respectively, wherein a third height is greater than the second height and the first height, and the second height is greater than the first height.

2. The semiconductor device as claimed in claim 1, wherein the gate dielectric layer comprises an oxide layer.

3. The semiconductor device as claimed in claim 2, wherein the poly gate electrode is in contact with the gate dielectric layer.

4. The semiconductor device as claimed in claim 1, wherein the multi-layered gate dielectric layer comprises an interfacial layer, and a bottom surface of the interfacial layer is lower than a top surface of the isolation structure.

5. The semiconductor device as claimed in claim 1, wherein an aspect ratio of the poly gate is less than that of the metal gate.

6. The semiconductor device as claimed in claim 1, further comprising an etching stop layer on sidewalls of the metal gate and sidewalls of the poly gate.

7. A semiconductor device, comprising:
a substrate comprising an isolation structure, a first region and a second region;
a first gate disposed on the first region of the substrate, the first gate comprising an interfacial layer; a first dielectric layer on the interfacial layer; and a first gate electrode on the first dielectric layer;
a second gate disposed on the second region of the substrate, the second gate comprising a second dielectric layer and a second gate electrode on the second dielectric layer, wherein the second dielectric layer having a bottom surface substantially levelled with a top surface of the isolation structure, a bottom surface of the interfacial layer is recessed with respect to the bottom surface of the second dielectric layer, and top surfaces of the first dielectric layer and the second dielectric layer are elevated with respect to the bottom surface of the second dielectric layer at a differing height.

8. The semiconductor device as claimed in claim 7, wherein the second gate electrode comprises a poly gate electrode, and the second dielectric layer comprises an oxide layer.

9. The semiconductor device as claimed in claim 8, wherein the poly gate electrode is in contact with the oxide layer.

10. The semiconductor device as claimed in claim 7, further comprising:
a first channel located in the first region of the substrate and underlying the first gate;
first source/drain regions located in the first region of the substrate, and the first source/drain regions being located at opposite sides of the first channel;
first metal silicide layers covering the first source/drain regions, wherein top surfaces of the first metal silicide layers are lower than the top surface of the isolation structure;
second source/drain regions located in the second region of the substrate, and the second source/drain regions being located at opposite sides of the second channel; and second metal silicide layers covering the second source/drain regions, wherein top surfaces of the second metal silicide layers are higher than the top surface of the first metal silicide layers.

11. The semiconductor device as claimed in claim 7, further comprising first spacers on sidewalls of the first gate and second spacers on sidewalls of the second gate.

12. The semiconductor device as claimed in claim 7, further comprising:
first spacers on sidewalls of the first gate and second spacers on sidewalls of the second gate, wherein bottom surfaces of the first spacers are lower than bottom surfaces of the second spacers; and
an etching stop layer around the first spacers and the second spacers.

13. A semiconductor device, comprising:
a substrate comprising an isolation structure, a first region and a second region, wherein the first region is spaced apart from the second region by the isolation structure;
a metal gate disposed on the first region of the substrate, wherein the metal gate comprises a first gate dielectric layer and a metal gate electrode on the first gate dielectric layer, and the first gate dielectric layer comprises an interfacial layer and a first dielectric layer on the interfacial layer; and
a poly gate disposed on the second region of the substrate, wherein the poly gate comprises a second gate dielectric layer and a poly gate electrode on the second gate dielectric layer, and a thickness of the second gate dielectric layer is greater than an overall thickness of the interfacial layer and the first dielectric layer, wherein a bottom-most surface of the first gate dielectric layer is offset from a bottom surface of the second gate dielectric layer in a first direction, a top-most surface of the first dielectric layer is offset from the bottom surface of the second gate dielectric layer and a top surface of the second gate dielectric layer is offset from the top-most surface of the first dielectric layer in a second direction opposite to the first direction.

14. The semiconductor device as claimed in claim 13, wherein the first dielectric layer of the first gate dielectric layer comprises a high-k dielectric layer.

15. The semiconductor device as claimed in claim 13, wherein the second gate dielectric layer comprises a gate oxide layer, and the poly gate electrode is in contact with the gate oxide layer.

16. The semiconductor device as claimed in claim 13, wherein a gate area of the poly gate is greater than that of the metal gate.

17. The semiconductor device as claimed in claim 13 further comprising:
first metal silicide layers disposed on the first region of the substrate and located at opposite sides of the metal gate; and
second metal silicide layers disposed on the second region of the substrate and located at opposite sides of the poly gate, wherein top surfaces of the first metal silicide layers are lower than top surfaces of the second metal silicide layers.

18. The semiconductor device as claimed in claim 13, wherein the second gate dielectric layer comprises a homogeneous gate dielectric layer.

* * * * *